United States Patent
Kim

(10) Patent No.: US 8,785,245 B2
(45) Date of Patent: Jul. 22, 2014

(54) METHOD OF MANUFACTURING STACK TYPE SEMICONDUCTOR PACKAGE

(75) Inventor: Woo-jae Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 326 days.

(21) Appl. No.: 13/167,324

(22) Filed: Jun. 23, 2011

(65) Prior Publication Data

US 2012/0015481 A1  Jan. 19, 2012

(30) Foreign Application Priority Data

Jul. 15, 2010  (KR) .................. 10-2010-0068586

(51) Int. Cl.
 *H01L 21/50* (2006.01)

(52) U.S. Cl.
 USPC .................... 438/108; 438/107; 257/E21.499

(58) Field of Classification Search
 USPC ............................ 438/107, 108; 257/E21.499
 See application file for complete search history.

(56) References Cited

U.S. PATENT DOCUMENTS

| | | | |
|---|---|---|---|
| 2008/0179740 A1* | 7/2008 | Liao | 257/738 |
| 2009/0305464 A1* | 12/2009 | Howard et al. | 438/109 |
| 2010/0027228 A1* | 2/2010 | Tsukada et al. | 361/772 |
| 2010/0044860 A1* | 2/2010 | Haba et al. | 257/737 |
| 2010/0314161 A1* | 12/2010 | Oh et al. | 174/257 |
| 2011/0080714 A1* | 4/2011 | Tsukada et al. | 361/774 |
| 2011/0115081 A1* | 5/2011 | Osumi | 257/737 |
| 2011/0140259 A1* | 6/2011 | Cho et al. | 257/686 |
| 2011/0204986 A1* | 8/2011 | Funabiki | 331/158 |
| 2012/0104606 A1* | 5/2012 | Okuda et al. | 257/738 |

FOREIGN PATENT DOCUMENTS

| | | |
|---|---|---|
| JP | 2007-287906 | 11/2007 |
| JP | 2008-263121 | 10/2008 |
| KR | 10-0772103 | 8/2007 |

* cited by examiner

*Primary Examiner* — Charles Garber
*Assistant Examiner* — Stanetta Isaac
(74) *Attorney, Agent, or Firm* — F. Chau & Associates, LLC

(57) ABSTRACT

A method of manufacturing a stack type semiconductor package is provided. A lower semiconductor package including a circuit board on which a semiconductor chip and electrode pads are formed is provided. A plurality of metal pins are adhered and fixed to the electrode pads of the circuit board of the lower semiconductor package, respectively. An upper semiconductor package is vertically stacked on the lower semiconductor package via the metal pins.

18 Claims, 13 Drawing Sheets

METHOD OF MANUFACTURING STACK TYPE SEMICONDUCTOR PACKAGE

CROSS-REFERENCE TO RELATED APPLICATIONS

This application claims the benefit of Korean Patent Application No. 10-2010-0068586, filed on Jul. 15, 2010, in the Korean Intellectual Property Office, the entire disclosure of which is incorporated herein by reference.

BACKGROUND

The inventive concept relates to a method of manufacturing a semiconductor package, and more particularly, to a method of manufacturing a stack type semiconductor package in which a plurality of packages are stacked.

Semiconductor packages have been developed for their multiple functions, high capacity, and small size. A stack type semiconductor package refers to a package in which a plurality of semiconductor packages, that have been individually packaged and electrically tested, are vertically stacked. The stack type semiconductor package is also referred to as a package-on-package (POP) in which an upper semiconductor package is stacked on a lower semiconductor package.

In a stack type semiconductor package, an upper semiconductor package is to be stably stacked on a lower semiconductor package. If pitches of external connection terminals of the stack type semiconductor package, e.g., pitches of solder balls, are reduced and thus become fine, there is a need for method of manufacturing a stack type semiconductor package that facilitates stacking of an upper semiconductor package on a lower semiconductor package.

SUMMARY

The embodiments of the inventive concept provide a method of manufacturing a stack type semiconductor package in which stacking of an upper semiconductor package including external connection terminals having fine pitches on a lower semiconductor package is facilitated.

According to an aspect of the inventive concept, there is provided a method of manufacturing a stack type semiconductor package, including providing a lower semiconductor package including a circuit board on which a semiconductor chip and electrode pads are formed, adhering and fixing a plurality of metal pins respectively to the electrode pads of the circuit board of the lower semiconductor package, and vertically stacking an upper semiconductor package on the lower semiconductor package via the metal pins.

The metal pins may be adhered and fixed to the electrode pads using a jig which is an external fixing unit. The metal pins may extend vertically with respect to the circuit board. The metal pins may extend to a height which is higher than that of the semiconductor chip of the lower semiconductor package.

Plating layers may be formed respectively at lower parts of the metal pins which are connected to the electrode pads. Upper ends of the metal pins connected to the upper semiconductor package may be formed flat. Holes may be formed in centers of the upper ends of the metal pins which are connected to the upper semiconductor package. An organic solderability preservative (OSP) surface treatment may be performed on the upper ends of the metal pins which are connected to the upper semiconductor package.

The semiconductor chip may be electrically connected to the circuit board by using a flip-chip method or a wire bonding method. After fixing the metal pins, the method may further include forming a sealing layer which leaves exposed upper surfaces of the metal pins and completely molds the circuit board, the semiconductor chip, and the remaining portions of the metal pins.

According to another aspect of the inventive concept, there is provided a method of manufacturing a stack type semiconductor package, including providing a lower semiconductor package including a circuit board including an upper surface to which a semiconductor chip is adhered and on which a plurality of electrode pads are positioned, adhering and fixing a plurality of metal pins to the circuit board by using a jig, wherein the metal pins are positioned on the circuit board to correspond to the same arrangement by which the electrode pads are positioned, and vertically stacking an upper semiconductor package on the metal pins, wherein the upper semiconductor package is electrically connected to the metal pins.

The adhering and fixing of the metal pins may include providing the jig including a metal plate and a plurality of holes formed in the metal plate, wherein the holes are positioned to correspond to the same arrangement by which the electrode pads of the circuit board are positioned, positioning the metal pins in the holes; stacking the jig including the metal pins on the circuit board, and separating the metal plate from metal pins and the circuit board.

The upper semiconductor package may include upper electrode pads and external connection terminals, wherein the upper electrode pads correspond to the metal pins and are connected to the metal pins through the external connection terminals. Pitches of the metal pins may be equal to pitches of the external connection terminals. The metal pins may include copper layers.

The semiconductor chip may be formed on the upper surface of the circuit board by using a flip-chip method, wherein an underfill layer is formed on the circuit board under the semiconductor chip formed by the flip-chip method. The upper semiconductor package may be a multi-chip package.

According to another aspect of the inventive concept, there is provided a method of manufacturing a stack type semiconductor package, including providing a lower semiconductor package including a circuit board including an upper surface to which a semiconductor package is adhered and on which a plurality of electrode pads are positioned, forming conductive adhesive layers respectively on the electrode pads of the circuit board, providing a jig including a metal plate and holes formed in the metal plate, wherein the holes are positioned to correspond to the same arrangement by which the electrode pads of the circuit board are positioned, positioning the metal pins in the holes of the jig, stacking the jig including the metal pins on the conductive adhesive layers, wherein the metal pins are positioned to correspond to the same arrangement by which the electrode pads are positioned, reflowing the conductive adhesive layers, separating the metal plate of the jig from the circuit board and thus forming the plurality of metal pins on the circuit board, wherein the metal pins are positioned to correspond to the same arrangement by which the electrode pads are positioned, and vertically stacking an upper semiconductor package on the metal pins so that the upper semiconductor package is electrically connected to the metal pins.

When reflowing the conductive adhesive layers, the metal pins may be adhered and fixed to the conductive adhesive layers, respectively. The upper semiconductor package may include external connection terminals, wherein pitches of the metal pins are equal to pitches of the external connection terminals.

According to an aspect of the inventive concept, there is provided a method of manufacturing a stack type semiconductor package, including providing a lower semiconductor package comprising a circuit board having an upper surface on which a plurality of electrode pads are positioned, providing a jig comprising a metal plate and holes formed in the metal plate, wherein the holes are spaced apart from each other at a predetermined pitch, positioning metal pins in the holes, stacking the jig comprising the metal pins on the circuit board, separating the metal plate of the jig from the circuit board to form the metal pins on the circuit board, wherein the metal pins are spaced apart from each other at the predetermined pitch, and vertically stacking an upper semiconductor package on the metal pins, wherein the upper semiconductor package is electrically connected to the metal pins via a plurality of connection terminals spaced apart from each other at the predetermined pitch.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
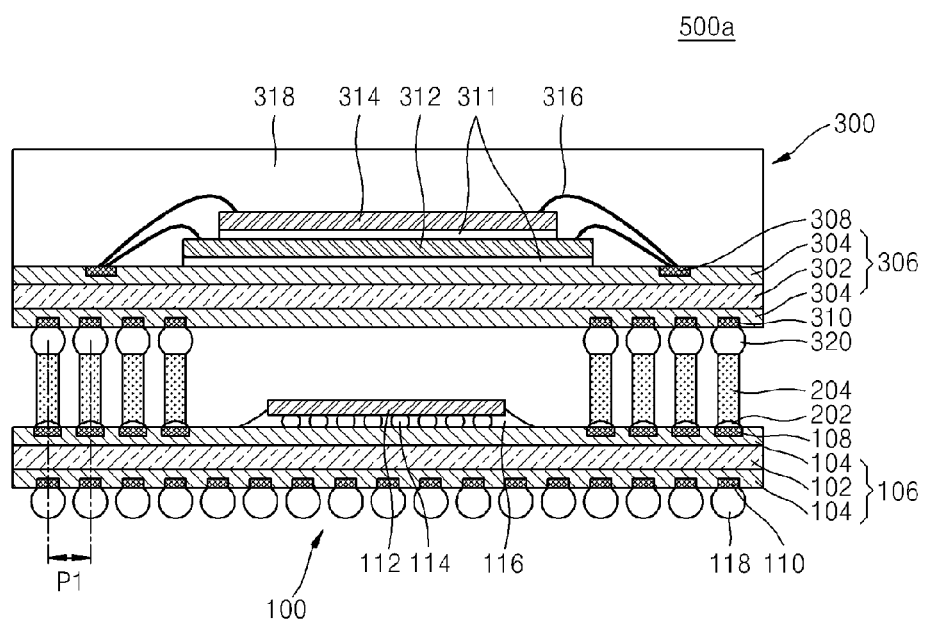
FIG. 1 is a cross-sectional view of a stack type semiconductor package according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein. Like reference numerals in the drawings may denote like elements. In the drawings, the thicknesses of layers and regions may be exaggerated for clarity.

FIG. 1 is a cross-sectional view of a stack type semiconductor package 500a according to an embodiment of the inventive concept.

Referring to FIG. 1, the stack type semiconductor package 500a according to an embodiment includes a lower semiconductor package 100 and an upper semiconductor package 300. The lower and upper semiconductor packages 100 and 300 correspond to packages which have been individually packaged and electrically tested.

The lower semiconductor package 100 includes a circuit board 106 having a core layer 102 and photo-solder resist layers 104 on opposite surfaces of the core layer 102. The circuit board 106 may be referred to as a wiring substrate. The circuit board 106 refers to a board on which circuit wires are formed, and may be, for example, a printed circuit board (PCB). A plurality of first electrode pads 108 are formed in an upper surface of the circuit board 106 and are insulated from one another by portions of the top photo-solder resist layer 104 formed between the first electrode pads 108. According to an embodiment, the first electrode pads 108 are positioned at regular distances in the circuit board 106. A plurality of second electrode pads 110 are formed in a lower surface of the circuit board 106 and are insulated from one another by portions of the bottom photo-solder resist layer 104 formed between the second electrode pads 110.

External connection terminals 118 are respectively formed on the second electrode pads 110 to be connected to an external device(s) (not shown). The external connection terminals 118 may be, for example, solder balls. The first and second electrode pads 108 and 110 may be referred to as solder ball lands. Although not shown in FIG. 1, the first electrode pads 108 are electrically connected to the second electrode pads 110 through wiring layers (not shown) which are formed in the core layer 102 of the circuit board 106 and the photo-solder resist layers 104.

A semiconductor chip 112 is adhered to a center of the upper surface of the circuit board 106 and is electrically connected to the circuit board 106 through chip connection terminals 114. Although not shown in FIG. 1, the semiconductor chip 112 is electrically connected to the first electrode pads 108 through the chip connection terminals 114 and wiring lines (not shown) in the circuit board 106.

According to an embodiment, the semiconductor chip 112 is adhered to the circuit board 106 by using a flip-chip method. An underfill layer 116 is formed on the circuit board 106, and is positioned underneath the semiconductor chip 112. The underfill layer 116 protects the chip connection terminals 114 and fixes the semiconductor chip 112 onto the circuit board 106. Accordingly, the circuit board 106, the first electrode pads 108, the second electrode pads 110, the semiconductor chip 112, and the chip connection terminals 114, and the external connection terminals 118 are part of the lower semiconductor package 100.

Conductive adhesive layers 202 and metal pins 204 are respectively formed on the first electrode pads 108. The conductive adhesive layers 202 may be formed, for example, with a solder paste. The metal pins 204 may be formed, for example, of copper layers. The metal pins 204 may be referred to as metal posts. According to an embodiment, the metal pins 204 are adhered and fixed to the first electrode pads 108 with the conductive adhesive layers 202, respectively.

According to an embodiment, the metal pins 204 are adhered and fixed to the first electrode pads 108 by using a jig (not shown), which is an external fixing unit. According to an embodiment, if the jig is used, the metal pins 204 are formed with the same pitches P1 as fine pitches P1 of external connection terminals 320 of the upper semiconductor package 300. In other words, even if each of the fine pitches P1 of the external connection terminals 320 is 0.4 mm or less, for example, within a range between 0.1 mm and 0.3 mm, the pitches P1 of the metal pins 204 correspond to the fine pitches P1 of the external connection terminals 320. The metal pins 204 may be positioned at the same distances from each other as the distances between the first electrode pads 108. According to an embodiment, the metal pins 204 extend to height that is higher than the semiconductor chip 112, and extend vertically with respect to the circuit board 106. According to an embodiment, the method of adhering and fixing the metal pins 204 to the first electrode pads 108 by using the jig will be described in more detail below.

The upper semiconductor package 300 is vertically stacked on the lower semiconductor package 100 through the metal pins 204 positioned between the lower and upper semiconductor packages 100 and 300. The external connection terminals 320 of the upper semiconductor package 300 are connected to the metal pins 204 and thus are electrically connected to the lower semiconductor package 100. The external connection terminals 320 have the same pitches or substantially the same pitches as the pitches P1 of the metal pins 204. According to an embodiment, the upper semiconductor package 300 may be a multi-chip package.

The upper semiconductor package 300 will now be described in more detail. Like the lower semiconductor package 100, the upper semiconductor package 300 includes a circuit board 306 having a core layer 302 and photo-solder resist layers 304 on opposite surfaces of the core layer 302. Third electrode pads 308 are formed in an upper surface of the circuit board 306 and are insulated from each other by the top photo-solder resist layer 304 positioned between the third electrode pads 308. Two third electrode pads 308 are shown in FIG. 1. An adhesive layer 311 is interposed between the circuit board 306 and a semiconductor chip 312 and between the semiconductor chip 312 and a semiconductor chip 314 so that the semiconductor chips 312 and 314 are stacked on the circuit board 306.

The semiconductor chips 312 and 314 are connected to the third electrode pads 308 with wires 316. A sealing layer 318 is formed on the circuit board 306 on which the semiconductor chips 312 and 314 and the wires 316 have been formed. A plurality of fourth electrode pads 310 are formed in a lower surface of the circuit board 306 and are insulated from one another by the bottom photo-solder resist layer 304 positioned between the fourth electrode pads 310. The external connection terminals 320 are respectively formed on the fourth electrode pads 310. As described above, the external connection terminals 320 are stacked respectively on the metal pins 204 and thus are electrically connected to the lower semiconductor package 100. According to an embodiment, the external connection terminals 320 may be solder balls.

According to an embodiment, in the stack type semiconductor package 500a, the metal pins 204 having the fine pitches P1 are formed on the circuit board 106 of the lower semiconductor package 100 by using the jig. In this case, stacking of the the upper semiconductor package 300 including the external connection terminals 320 having the fine pitches (i.e., narrow pitches) P1 on the lower semiconductor package 100 is facilitated.

The metal pins 204 having the fine pitches P1 are formed in the lower semiconductor package 100 to correspond to the external connection terminals 320 of the upper semiconductor package 300 having the fine pitches P1. Thus, the entire size of the stack type semiconductor package 500a may be reduced. Although the upper semiconductor package 300 includes a larger number of external connection terminals 320 having the fine pitches P1, a larger number of metal pins 204 having the fine pitches P1 is formed in the lower semiconductor package 100 according to the upper semiconductor package 300.

Figure 2:
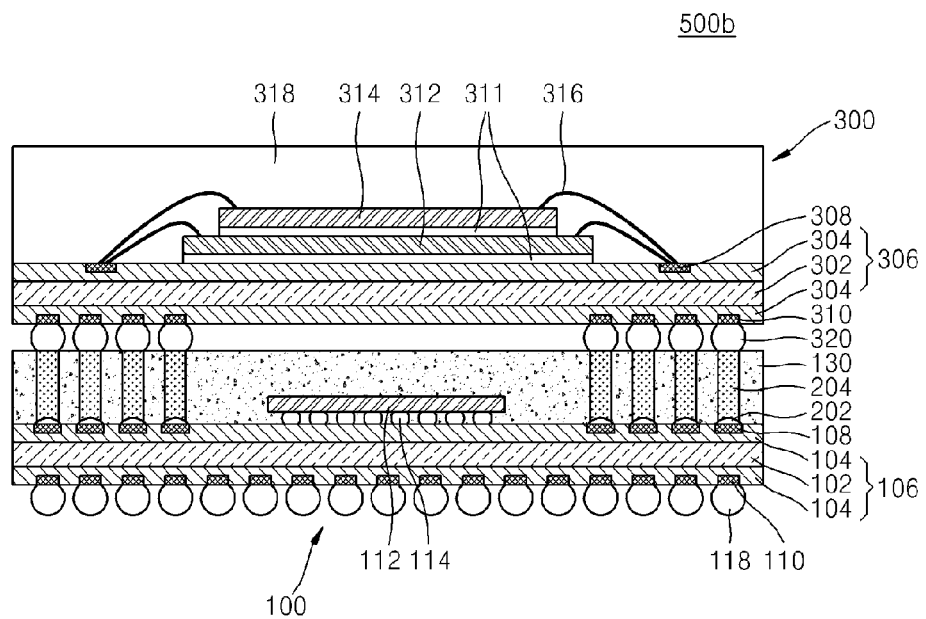
FIG. 2 is a cross-sectional view of a stack type semiconductor package according to an embodiment of the inventive concept.

FIG. 2 is a cross-sectional view of a stack type semiconductor package 500b according to an embodiment of the inventive concept Referring to FIG. 2, the stack type semiconductor package 500b has the same structure and effect as the stack type semiconductor package 500a, except that a sealing layer 130 is formed on a circuit board 106 and an underfill layer 116 is not formed.

The stack type semiconductor package 500b includes the sealing layer 130 leaves upper surfaces of metal pins 204 exposed and molds the circuit board 106, a semiconductor chip 112, and the metal pins 204. In other words, the sealing layer 130 molds an entire surface of the circuit board 106 on which the semiconductor chip 112 and the metal pins 204 have been formed.

As a result, the metal pins 204 are stably fixed onto first electrode pads 108 by the sealing layer 130. An upper semiconductor package 300 having external connection terminals 320 is stacked on the metal pins 204 which have been stably fixed by the sealing layer 130.

Figure 3:
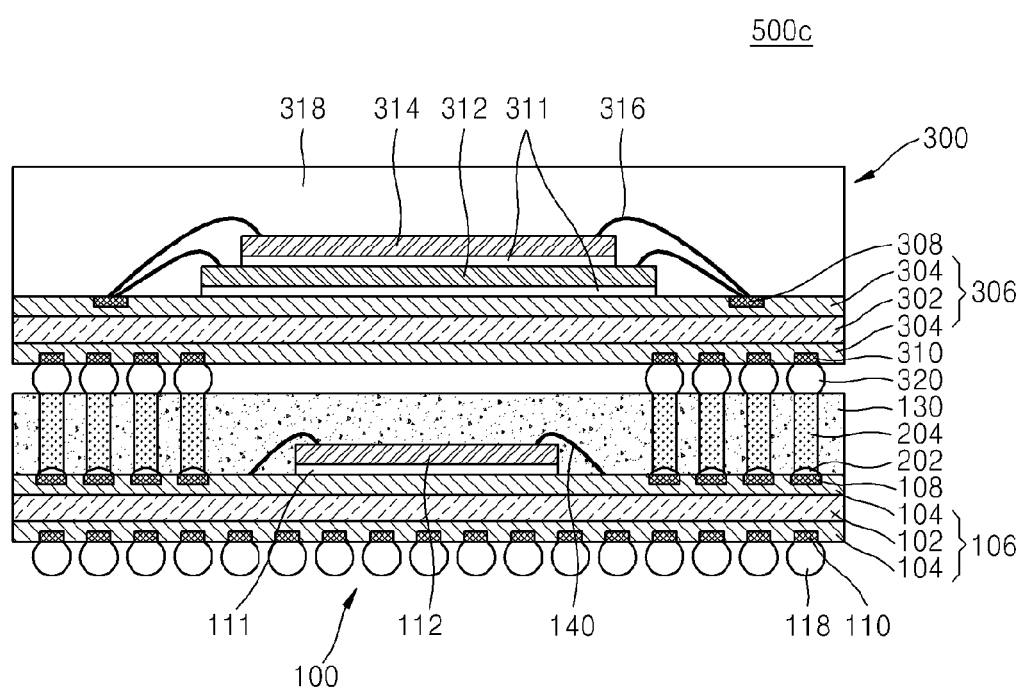
FIG. 3 is a cross-sectional view of a stack type semiconductor package according to an embodiment of the inventive concept.

FIG. 3 is a cross-sectional view of a stack type semiconductor package 500c according to an embodiment of the inventive concept.

In more detail, the stack type semiconductor package 500c has the same structure and effect as the stack type semiconductor package 500b, except that a semiconductor chip 112 is connected to a circuit board 106 through wires 140.

In the stack type semiconductor package 500c, an adhesive layer 111 is interposed between the semiconductor chip 112 and the circuit board 106, thereby mounting the semiconductor chip 112 on the circuit board 106. The semiconductor chip 112 is electrically connected to the circuit board 106 through the wires 140 by using a wire bonding method. According to an embodiment, the semiconductor chip 112 is mounted on the circuit board 106 by using the wiring bonding method and not the flip-chip method and thus is electrically connected to the circuit board 106 via the wires 140.

Metal pins 204 and a sealing layer 130 are formed on the circuit board 106, and then second external connection terminals 320 of an upper semiconductor package 300 are formed on the metal pins 204 which are stably fixed by the sealing layer 130. The upper semiconductor package 300 having the second connection terminals 320 is stacked on the metal pins 204.

The structures of the metal pins 204 which are used in the stack type semiconductor packages 500a, 500b, and 500c of FIGS. 1 through 3 will now be described in more detail.

Figure 4:
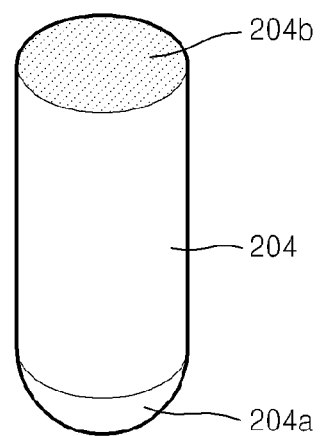
FIGS. 4 and 5 are enlarged schematic views of one of a plurality of metal pins shown in FIGS. 1 through 3, according to embodiments of the inventive concept.
Figure 5:
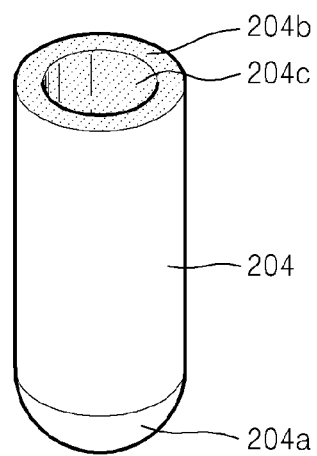

FIGS. 4 and 5 are enlarged schematic views of one of the metal pins 204 shown in FIGS. 1 through 3, according to embodiments of the inventive concept.

In more detail, as shown in FIGS. 4 and 5, a plating layer 204a is formed at a lower part of the metal pin 204, i.e., a part of the metal pin 204 connected to the electrode pad 108. The plating layer 204a may be formed of a tin (Sn) layer or a tin alloy layer. The addition of the plating layer 204a improves an adhesive strength of the metal pin 204 with the electrode pad 108.

According to an embodiment, an upper end 204b of the metal pin 204 connected to the upper semiconductor package 300 has a flat surface as shown in FIG. 4. Alternatively, the upper end 204b of the metal pin 204 connected to the upper semiconductor package 300 has a hole 204c in a center thereof, as shown in FIG. 5. If the hole 204c is formed in the upper end 204b of the metal pin 204, the external connection terminal 320 may be more stably stacked on the metal pin 204 since a portion of the external connection terminal 320 is received in the hole 204c, thereby also forming a more stable electrical connection between the upper and lower semiconductor packages 300 and 100.

According to an embodiment, an organic solderability preservative (OSP) surface treatment may be performed on the upper end 204b of the metal pin 204 connected to the upper semiconductor package 300. The OSP surface treatment prevents the metal pin 204, e.g., a copper layer, from being oxidized when manufacturing a stack type semiconductor package.

Figure 6:
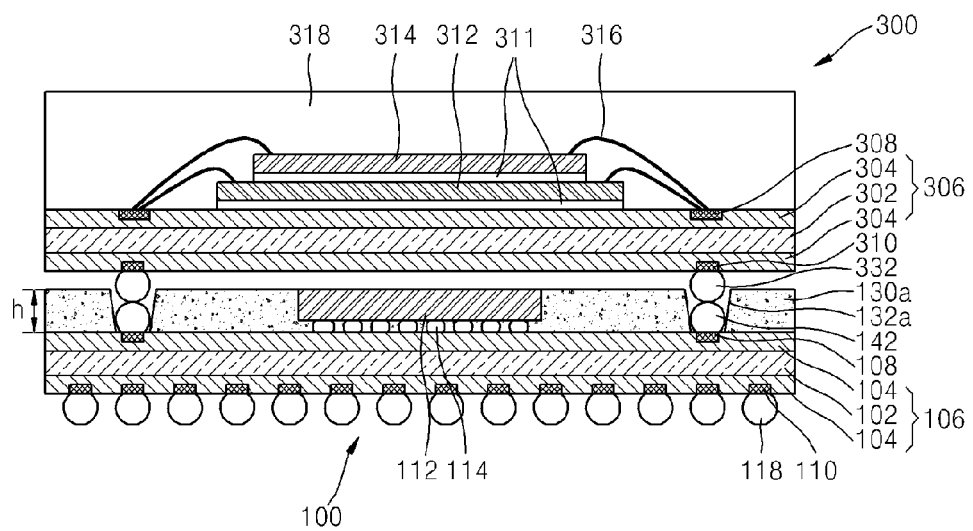
FIGS. 6 and 7 are cross-sectional views of comparative stack type semiconductor packages for comparing with a stack type semiconductor package according to an embodiment of the inventive concept.
Figure 7:
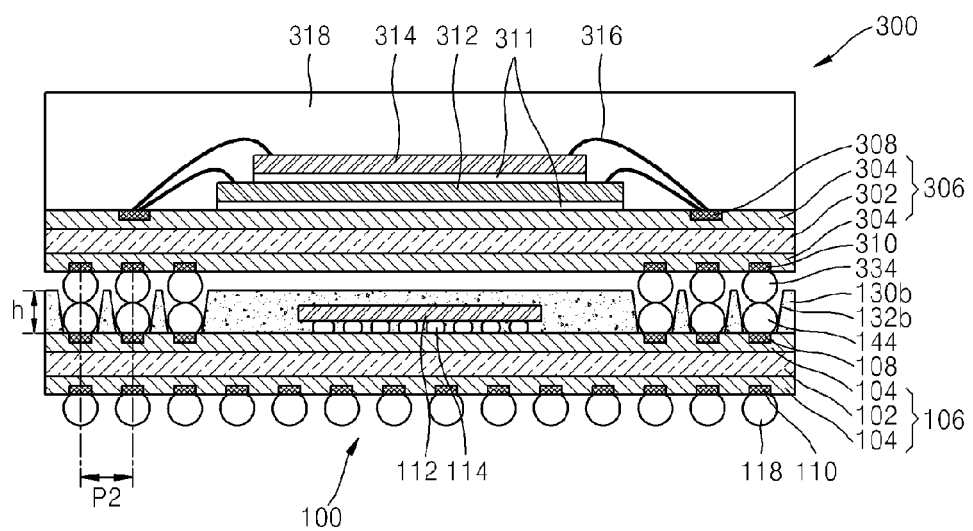

FIGS. 6 and 7 are cross-sectional views of comparative stack type semiconductor packages 600a and 600b for comparing with stack type semiconductor packages of embodiments of the inventive concept.

In the comparative stack type semiconductor package 600a of FIG. 6, via-holes 132a are formed in a molding process for forming a sealing layer 130a in a lower semiconductor package 100. In other words, in the comparative stack type semiconductor package 600a, the sealing layer 130a is formed in an entire area including a semiconductor chip 112, except for where electrode pads 108 are formed. External connection terminals 142 of the lower semiconductor package 100 are respectively formed in the via-holes 132a. Also, external connection terminals 332 of an upper semiconductor package 300 are stacked respectively on the external connection terminals 142 of the lower semiconductor package 100.

In the comparative stack type semiconductor package 600b of FIG. 7, a sealing layer 130b is formed on an entire surface of a circuit board 106 on which a semiconductor chip 112 has been formed. Also, parts of the sealing layer 130b of a lower semiconductor package 100 are removed by, for example, laser, thereby forming via-holes 132b. External connection terminals 144 of the lower semiconductor package 100 are formed respectively in the via-holes 132b, and external connection terminals 334 of an upper semiconductor package 300 are respectively stacked on the external connection terminals 144 of the lower semiconductor package 100.

In the comparative stack type semiconductor packages 600a and 600b, sizes of the external connection terminals 332 and 334 of the upper semiconductor packages 300, e.g., sizes of solder balls, are larger than or equal to predetermined sizes based on heights "h" of the sealing layers 130a and 130b. Accordingly, in the comparative stack type semiconductor packages 600a and 600b, it is difficult to reduce the sizes of the external connection terminals 332 and 334.

Also, in the comparative stack type semiconductor packages 600a and 600b, heights of the external connection terminals 142 and 144 of the lower semiconductor packages 100, e.g., heights of the solder balls, are lower than heights of the via-holes 132a and 132b. Thus, the lower and upper semiconductor packages 100 and 300 may be stacked when the external connection terminals 332 and 334 of the upper semiconductor packages 300 are larger than or equal to predetermined sizes. Therefore, in the comparative stack type semiconductor packages 600a and 600b, it is difficult to reduce the sizes or pitches of the external connection terminals 332 and 334. For example, each of pitches P2 of the external connection terminals 142 and 144, and 332 and 334 of the lower and upper semiconductor packages 100 and 300 of the comparative stack type semiconductor package 600b of FIG. 7 is larger than 0.4 mm.

Methods of manufacturing stack type semiconductor packages as described with reference to FIGS. 1 through 5 will now be described.

Figure 8:
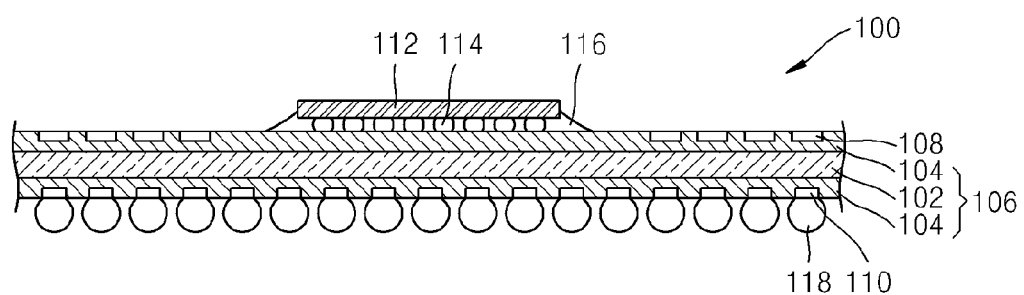
FIGS. 8 through 10 are cross-sectional views illustrating a method of manufacturing a stack type semiconductor package, according to an embodiment of the inventive concept.
Figure 9:
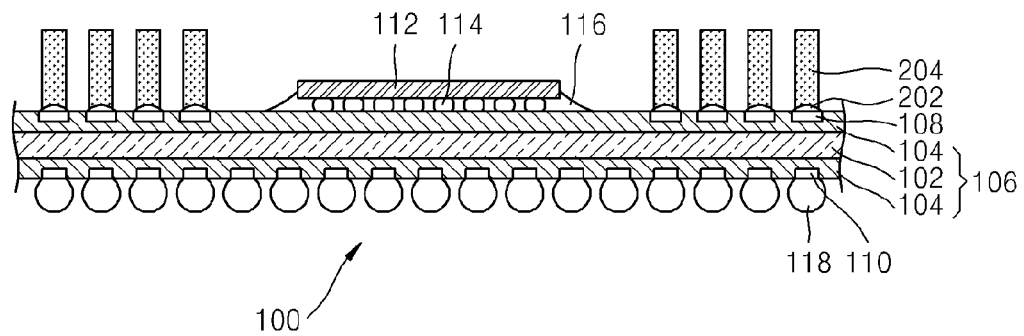
Figure 10:
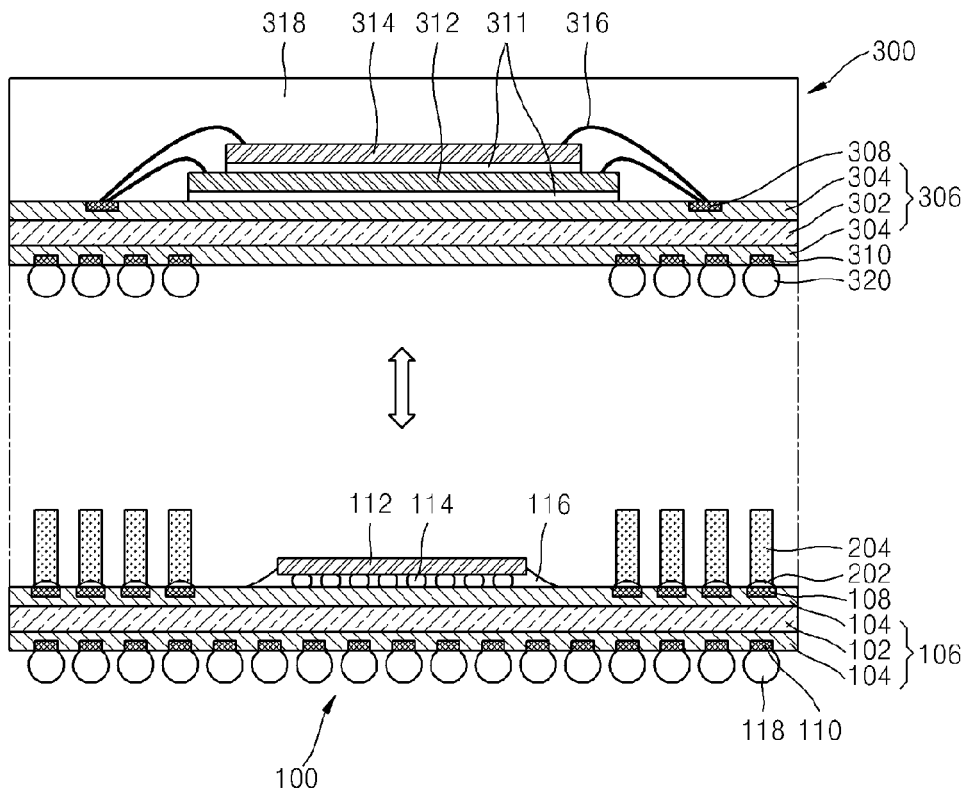
Figure 11:
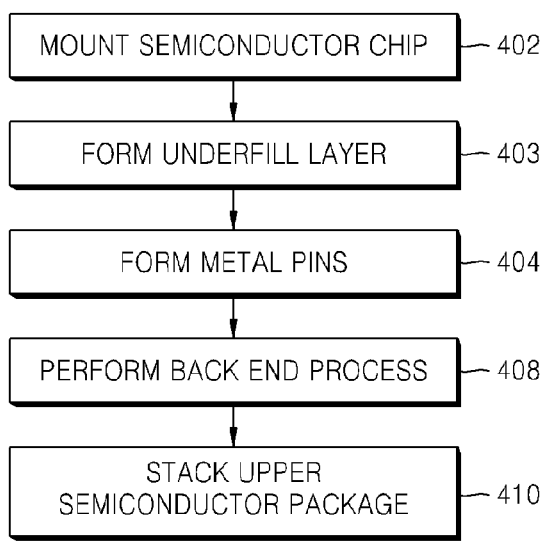
FIG. 11 is a flowchart of the method described in connection with FIGS. 8 through 10.

FIGS. 8 through 10 are cross-sectional views illustrating a method of manufacturing a stack type semiconductor package, according to an embodiment of the inventive concept. FIG. 11 is a flowchart of the method described in connection with FIGS. 8 through 10.

Referring to FIGS. 8 and 11, a circuit board 106 including a core layer 102, photo-solder resist layers 104, first electrode pads 108, and second electrode pads 110 is provided. In operation 402, a semiconductor chip 112 having chip connection terminals 114 is mounted on the circuit board 106 by using a flip-chip method. In other words, the semiconductor chip 112 is mounted on the circuit board 106 by using a flip-chip attaching process. In the flip-chip method, a semiconductor substrate is mounted on the circuit board 106 by positioning an active surface of the semiconductor chip 112 in the down position (i.e., facing the circuit board 106).

One semiconductor chip 112 is mounted on the circuit board 106 is shown in FIG. 8. However, according to an embodiment, a plurality of semiconductor chips 112 may be mounted on the circuit board 106. In operation 403, an underfill layer 116 is formed on the circuit board 106 positioned under the semiconductor chip 112 which has been formed by using the flip-chip method. As described, the underfill layer 116 protects the chip connection terminals 114 and facilitates fixing of the semiconductor chip 112 onto the circuit board 106. The semiconductor chip 112 is electrically connected to the first electrode pads 108 through the chip connection terminals 114 on the circuit board 106. Accordingly, the circuit board 106, the first and second electrode pads 108 and 110, the semiconductor chip 112, the chip connection terminals 114, and external connection terminals 118 are included in a lower semiconductor package 100.

Referring to FIGS. 9 and 11, in operation 404, metal pins 204 are respectively formed on the first electrode pads 108 of the circuit board 106 of the lower semiconductor package 100, using conductive adhesive layers 202 to position the metal pins 204 on the first electrode pads 108. According to an embodiment, the conductive adhesive layers 202 are formed using a solder paste, and the metal pins 204 are formed of copper layers. The metal pins 204 are adhered and fixed to the first electrode pads 108 of the circuit board 206 with the conductive adhesive layers 202. The metal pins 204 extend vertically from the circuit board 106.

According to an embodiment, the metal pins 204 are adhered and fixed onto the first electrode pads 108 by using a jig, which is an external fixing unit. When using the jig, the metal pins 204 are formed to correspond to fine pitches of external connection terminals 320 of an upper semiconductor package 300, as described above. According to an embodiment, the metal pins 204 are spaced at the same distances as the first electrode pads 108 from each other. The method of forming the metal pins 204 by using the jig is described in more detail below.

Referring to FIGS. 10 and 11, in operation 408, a back end process is performed on the circuit board 106 on which the first and second electrode pads 108 and 110 and the metal pins 204 have been formed. The back end process refers to a process preparing the circuit board 106 for cutting into semiconductor chip units; and forming the external connection terminals 118 underneath the circuit board 106. In operation 410, the upper semiconductor package 300 having the external connection terminals 320 is vertically stacked on and is electrically connected to the lower semiconductor package 100 through the metal pins 204. Accordingly, the stack type semiconductor 500a of FIG. 1 can be completed.

FIGS. 12 through 15 are cross-sectional views illustrating a method of manufacturing a stack type semiconductor package, according to an embodiment of the inventive concept. FIG. 16 is a flowchart of the method described in connection with FIGS. 12 through 15.

Figure 12:
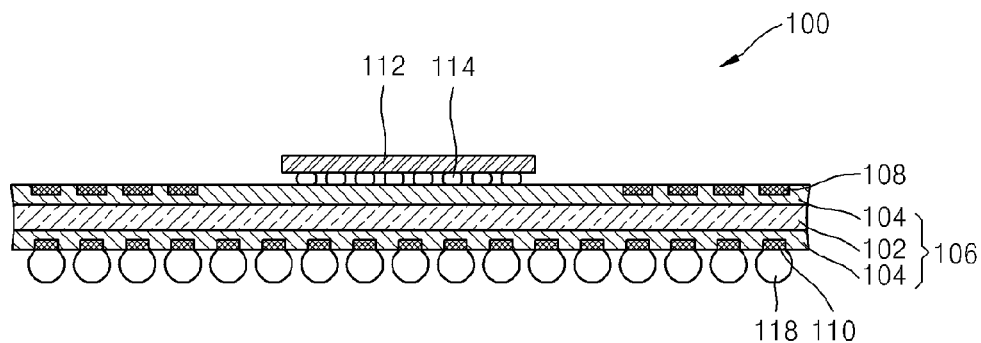
FIGS. 12 through 15 are cross-sectional views illustrating a method of manufacturing a stack type semiconductor package, according to an embodiment of the inventive concept.

Referring to FIGS. 12 and 16, in operation 402, a semiconductor chip 112 having chip connection terminals 114 is mounted on a circuit board 106 by using a flip-chip method. One semiconductor chip 112 is shown mounted on the circuit board 106 in FIG. 12, as in FIG. 8, but, according to an embodiment, a plurality of semiconductor chips 112 may be mounted on the circuit board 106.

Figure 13:
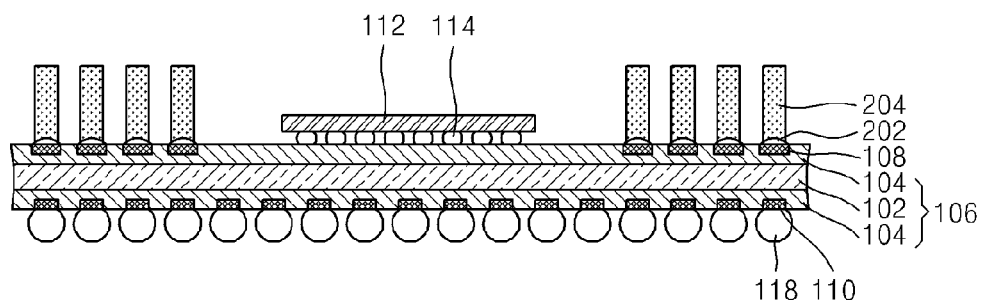
Figure 14:
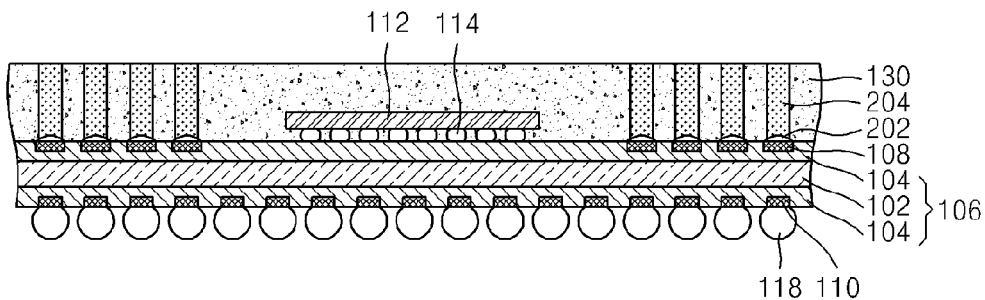

Referring to FIGS. 13, 14, and 16, in operation 404, metal pins 204 are respectively formed on first electrode pads 108 of the circuit board 106 using conductive adhesive layers 202 to fix the metal pins 204 to the circuit board 106. In operation 406, a sealing layer 130 is formed such that the upper surfaces of the metal pins 204 are left exposed and the circuit board 106, the semiconductor chip 112, and the remaining portion of the metal pins 204 are covered by the sealing layer 130. In other words, with the exception of the top surface of the metal pins 204, the sealing layer 130 molds an entire surface of the circuit board 106 on which the semiconductor chip 112 and the metal pins 204 have been formed. Therefore, the metal pins 204 are further stably fixed to the first electrode pads 108 by the sealing layer 130.

Figure 15:
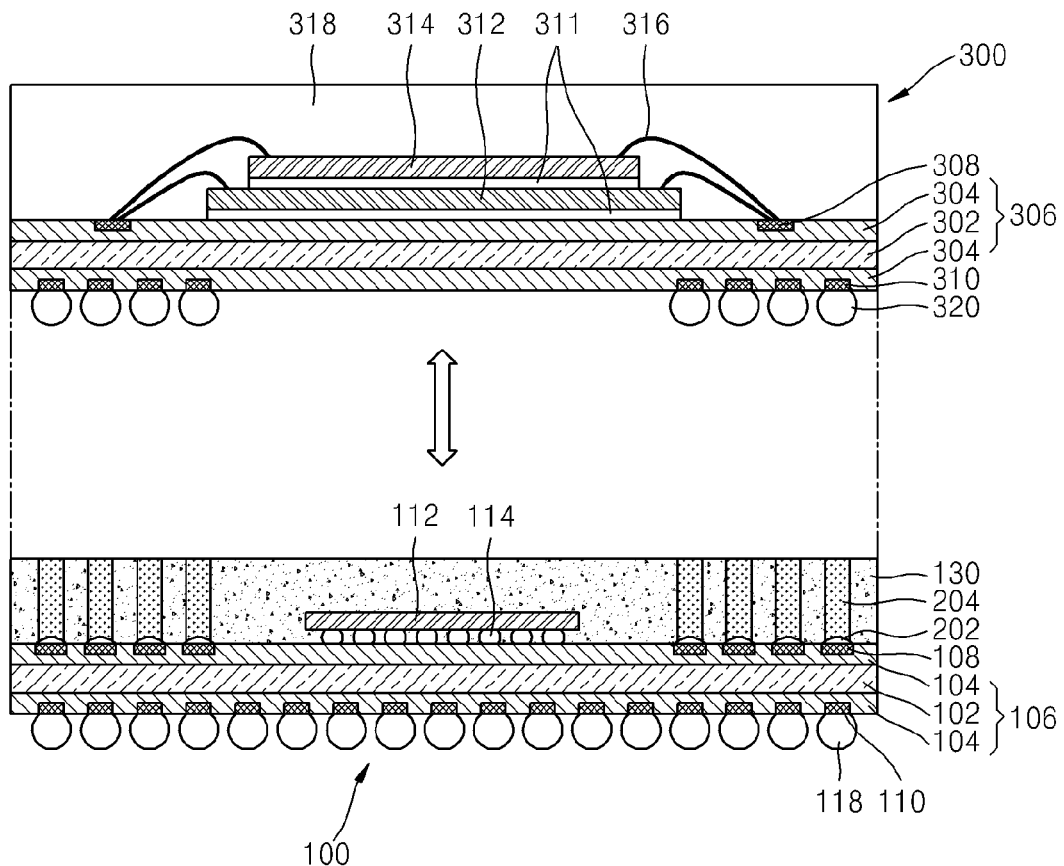
Figure 16:
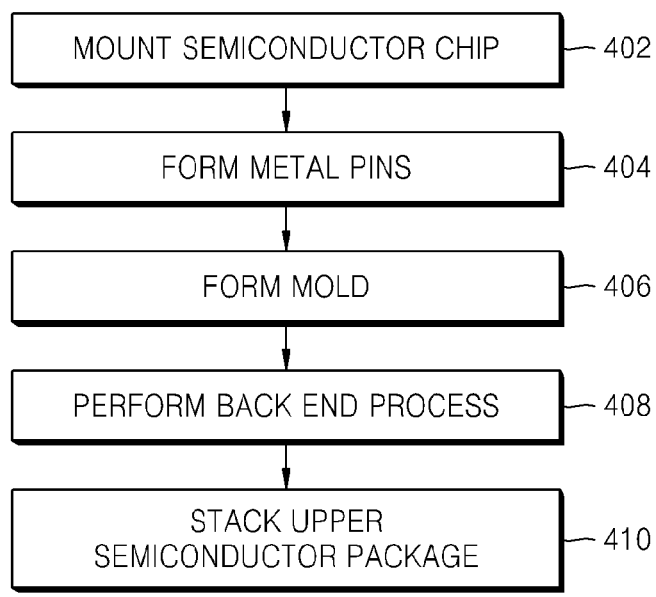
FIG. 16 is a flowchart of the method described in connection with FIGS. 12 through 15.

Referring to FIGS. 15 and 16, in operation 408, a back end process is performed on the circuit board 106 on which the first and second electrode pads 108 and 110 and the metal pins 204 have been formed. In operation 410, an upper semiconductor package 300 is vertically stacked on the lower semiconductor package 100 through the metal pins 204. Accordingly, the stack type semiconductor package 500b of FIG. 2 can be completed.

A method of forming the metal pins 204, which may be used in the stack type semiconductor packages 500a, 500b, and 500c of FIGS. 1 through 3, will now be described.

According to an embodiment, the metal pins 204 are formed by using a jig which is an external fixing unit.

FIGS. 17 through 22 are perspective views schematically illustrating a method of forming the metal pins 204, according to an embodiment of the inventive concept.

Figure 17:
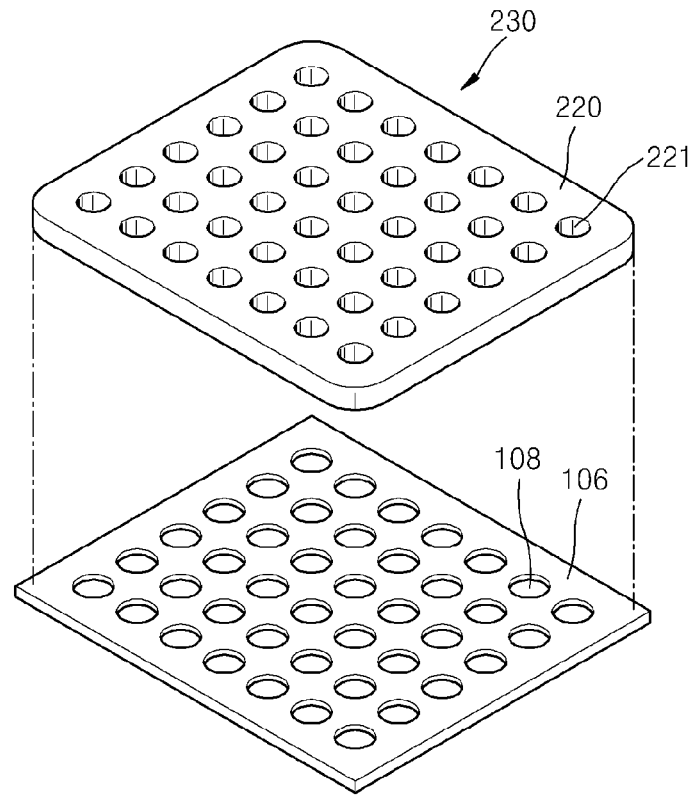
FIGS. 17 through 22 are perspective views schematically illustrating a method of forming metal pins, according to an embodiment of the inventive concept.

Referring to FIG. 17, a jig 230 is provided. The jig 230 includes a metal plate 220 and holes 221 which are formed in the metal plate 220. The holes 221 are arranged with the same spacing and positioning to correspond to the arrangement of the first electrode pads 108 on the circuit board 106. A lower part of FIG. 17 illustrates how the first electrode pads 108 are formed in the circuit board 106, and a semiconductor chip 112 is not shown in FIG. 17 for convenience of explanation. The first electrode pads 108 of the circuit board 106 have the same pitches as external connection terminals of an upper semiconductor package, as will be further described below.

Figure 18:
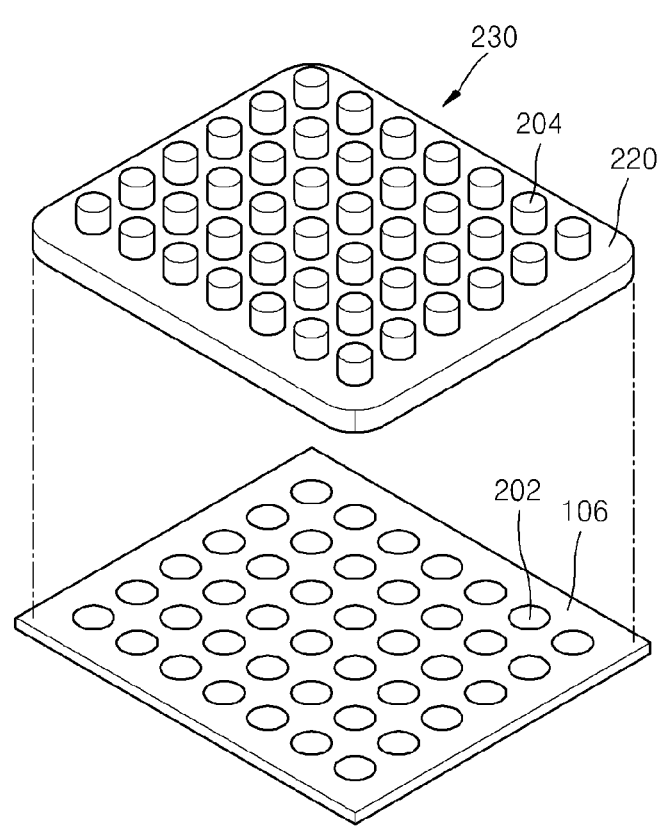

Referring to FIG. 18, the metal pins 204 are formed in the holes 221 of the jig 230. According to an embodiment, the metal pins 204 may be formed of copper layers. The metal pins 204 are lined up in the holes 221. Accordingly, the metal pins 204 are arranged with the same spacing and positioning to correspond to the arrangement of the first electrode pads 108. According to embodiments, the metal pins 204 have the same structures as the metal pins 204 described with reference to FIGS. 4 and 5.

Since the metal pins 204 are formed in the holes 221 of the jig 230, which is the external fixing unit, the metal pins 204 may be easily formed regardless of designated pitches of the metal pins 204. The conductive adhesive layers 202, e.g., a solder paste, are formed on the electrode pads 108 of the circuit board 106.

Figure 19:
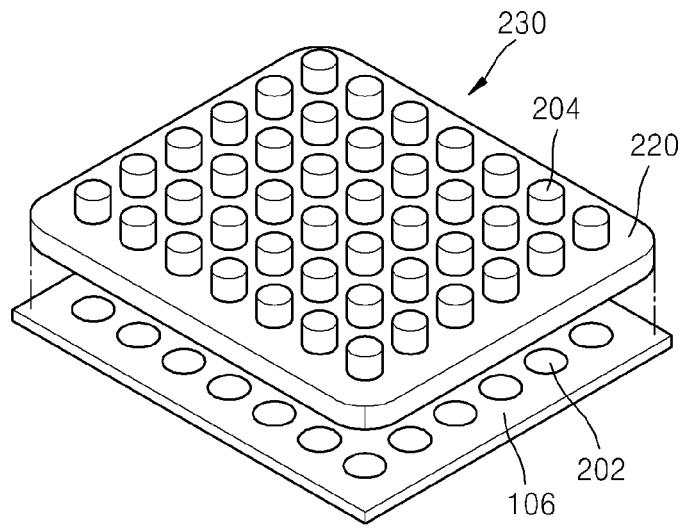
Figure 20:
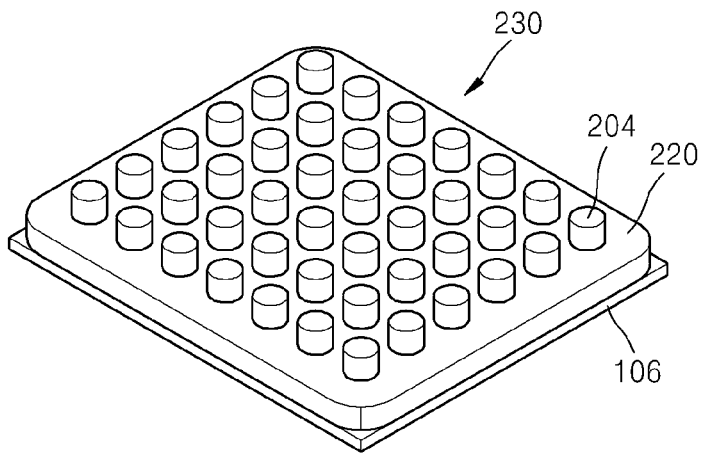

Referring to FIGS. 19 and 20, the jig 230 in which the metal pins 204 have been formed is stacked on the circuit board 106 on which the first electrode pads 108 and the conductive adhesive layers 202 have been formed. In other words, the metal pins 204 are stacked to correspond to the first electrode pads 108 and the conductive adhesive layers 202 of the circuit board 106. A reflow process is performed on the resultant structure including the jig 230 stacked on the circuit board 106 and thus a reflow process is performed on the conductive adhesive layers 202. The reflow process refers to a process of heating the resultant structure at an appropriate temperature in a reflow apparatus to melt and cool the conductive adhesive layers 202. When the conductive adhesive layers 202 undergo the reflow process, the metal pins 204 are adhered and fixed to the conductive adhesive layers 202.

Figure 21:
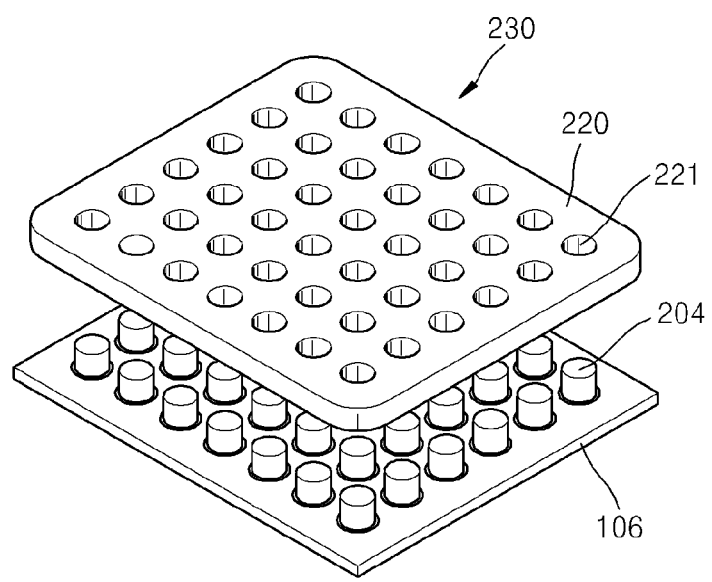
Figure 22:
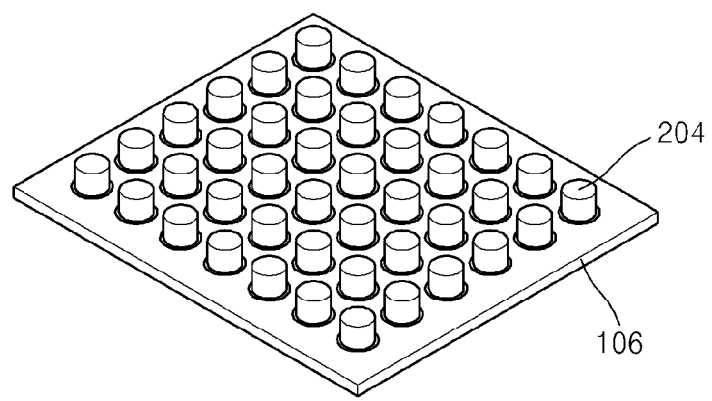

Referring to FIGS. 21 and 22, the metal plate 220 is separated from the circuit board 106. As a result, the metal pins 204 are formed and arranged on the circuit board 106 with the same spacing and positioning to correspond to that by which the electrode pads 108 are arranged. According to an embodiment, a defluxing process may be performed to remove unnecessary parts of the conductive adhesive layers 202.

Various applications using the stack type semiconductor packages 500a, 500b, and 500c of the inventive concept will now be described. Stack type semiconductor packages according to embodiments of the inventive concept will be denoted by the reference numeral 500 in FIGS. 23 through 25.

Figure 23:
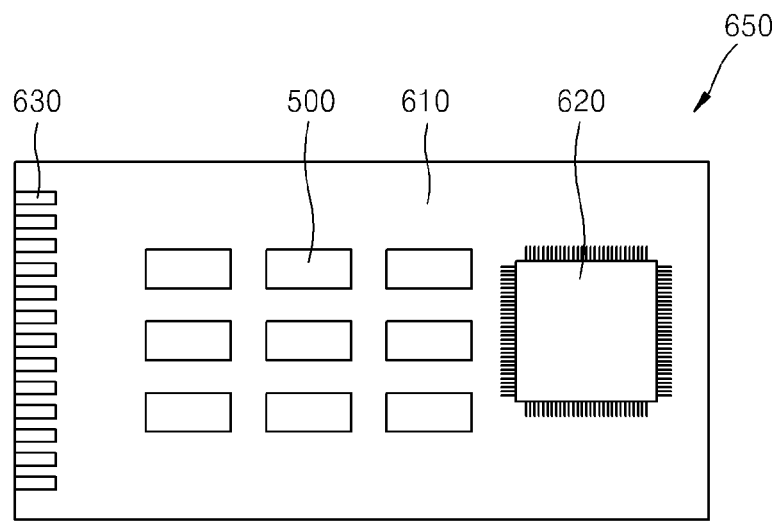
FIG. 23 is a schematic plane view of a package module including chip stack packages, according to an embodiment of the inventive concept.

FIG. 23 is a schematic plan view of a package module 650 using stack type semiconductor packages 500 according to an embodiment of the inventive concept.

Referring to FIG. 23, the stack type semiconductor packages 500 according to the inventive concept are applied to the package module 650. The plurality of stack type semiconductor packages 500 are attached onto a module substrate 610 in the package module 650. A package 620 is attached onto a side of the package module 650, and external connection terminals 630 are positioned on the other side of the package module 650. Although the stack type semiconductor packages 500 of the embodiments of the inventive concept are applied to the package module 650, the inventive concept is not limited thereof, and the stack type semiconductor packages 500 may be applied to various types of package modules.

Figure 24:
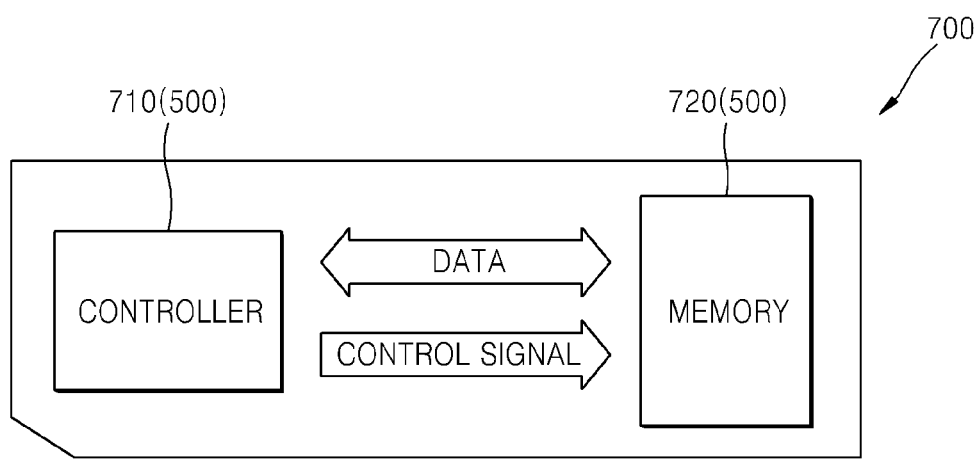
FIG. 24 is a schematic block diagram of a card including stack type semiconductor packages, according to an embodiment of the inventive concept.

FIG. 24 is a schematic block diagram of a card 700 using stack type semiconductor packages 500, according to an embodiment of the inventive concept.

In more detail, the stack type semiconductor packages 500 of the embodiments of the inventive concept are applied to the card 700. The card 700 may be a multimedia card (MMC), a secure digital card (SD), or the like. The card 700 includes a controller 710 and a memory 720. The memory 720 may be a flash memory, a phase change random access memory (PRAM), or another type of non-volatile memory. The controller 710 transmits a control signal to the memory 720, and thus the controller 710 and the memory 720 exchange data with each other according to control signals.

The stack type semiconductor packages 500 of the embodiments of the inventive concept may be used in the controller 710 and the memory 720 of the card 700. According to an embodiment, the card 700 may have a large memory capacity and include the controller 710 having various functions. Also, a thickness of the card 700 may be relatively thin, and lengths of wires may be shortened, thereby improving the performance of the card 700.

Figure 25:
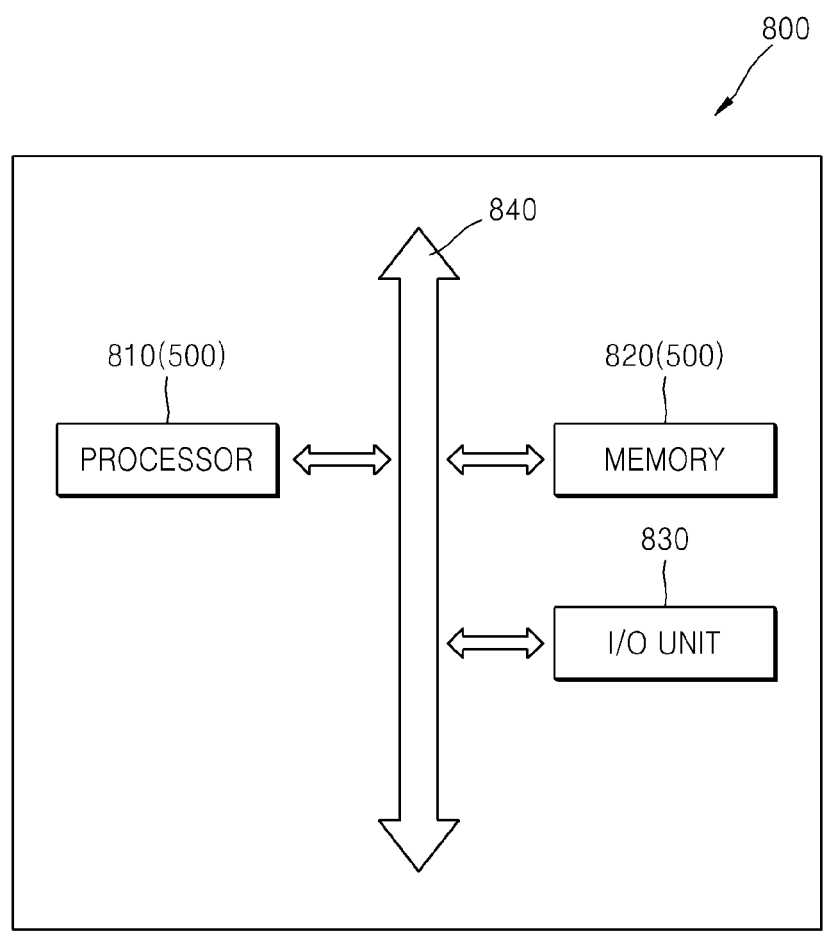
FIG. 25 is a schematic block diagram of an electronic system having stack type semiconductor packages, according to an embodiment of the inventive concept.

FIG. 25 is a schematic block diagram of an electronic system 800 using stack type semiconductor packages 500, according to an embodiment of the inventive concept.

In more detail, the electronic system 800 may be a computer, a mobile phone, an MPEG audio layer-3 (MP3) player, a navigator, or the like. The electronic system 800 includes a processor 810, a memory 820, and an input/output (I/O) unit 830. Control signals and/or data are exchanged between the processor 810 and the memory 820 or the I/O unit 830 through a communication channel 840.

The stack type semiconductor packages 500 of the embodiments of the inventive concept may be used in the processor 810 and the memory 820 of the electronic system 800. The electronic system 800 may realize various functions and may have improved reliability based on the addition of the stack type semiconductor packages 500 of the embodiments of the inventive concept.

While the inventive concept has been particularly shown and described with reference to exemplary embodiments thereof, it will be understood that various changes in form and details may be made therein without departing from the spirit and scope of the following claims.

What is claimed is:

1. A method of manufacturing a stack type semiconductor package, comprising:
    providing a lower semiconductor package comprising a circuit board on which a semiconductor chip and electrode pads are formed;
    fixing a plurality of metal pins respectively to the electrode pads of the circuit board of the lower semiconductor package by using a jig comprising a metal plate comprising an upper surface, a lower surface, and a plurality of holes formed in the metal plate, wherein the plurality of holes are positioned to correspond to a same arrangement by which the electrode pads of the circuit board are positioned, positioning the metal pins in the holes with the metal pins protruding from the upper surface of the metal plate, stacking the jig including the metal pins on the circuit board, and separating the metal plate from the metal pins and the circuit board, wherein the protruding metal pins pass through the upper and lower surfaces of the metal plate as the jig is separated, and wherein the plurality of metal pins comprise a plating layer formed at a lower portion of the metal pins, the plating layer being formed prior to fixing the plurality of metal pins; and
    vertically stacking an upper semiconductor package on the lower semiconductor package via the metal pins.

2. The method of claim 1, wherein the metal pins extend vertically with respect to the circuit board.

3. The method of claim 1, wherein the metal pins extend to a height which is higher than that of the semiconductor chip of the lower semiconductor package.

4. The method of claim 1, wherein ends of the metal pins connected to the upper semiconductor package are formed flat.

5. The method of claim 4, wherein holes are formed in centers of the ends of the metal pins which are connected to the upper semiconductor package.

6. The method of claim 1, wherein an organic solderability preservative (OSP) surface treatment is performed on ends of the metal pins which are connected to the upper semiconductor package.

7. The method of claim 1, wherein the semiconductor chip is electrically connected to the circuit board by using one of a flip-chip method and a wire bonding method.

8. The method of claim 1, wherein after fixing the metal pins, further comprising forming a sealing layer which leaves exposed upper surfaces of the metal pins and covers the circuit board, the semiconductor chip, and remaining portions of the metal pins.

9. A method of manufacturing a stack type semiconductor package, comprising:
    providing a lower semiconductor package comprising a circuit board comprising an upper surface to which a semiconductor chip is adhered and on which a plurality of electrode pads are positioned;
    fixing a plurality of metal pins to the circuit board using a jig comprising a metal plate and a plurality of holes formed in the metal plate, wherein the holes are positioned to correspond to a same arrangement by which the electrode pads of the circuit board are positioned, positioning the metal pins in the holes, stacking the jig including the meal pins on the circuit board, wherein the metal pins are positioned on the circuit board to correspond to the same arrangement by which the electrode pads are positioned, and wherein the metal plate comprises an upper surface and a lower surface, the lower surface faces the upper surface of the lower semiconductor package and the metal pins protrude from the upper surface of the metal plate, and separating the metal plate from the metal pins and the circuit board; and
    vertically stacking an upper semiconductor package on the metal pins, such that the upper surface of the lower semiconductor package and the lower surface of the metal plate are adjacent to each other, wherein the upper semiconductor package is electrically connected to the metal pins.

10. The method of claim 9, wherein the upper semiconductor package comprises upper electrode pads and external connection terminals, wherein the upper electrode pads correspond to the metal pins and are connected to the metal pins through the external connection terminals.

11. The method of claim 10, wherein pitches of the metal pins are equal to pitches of the external connection terminals.

12. The method of claim 9, wherein the metal pins comprise copper layers.

13. The method of claim 9, wherein the semiconductor chip is formed on the upper surface of the circuit board using a flip-chip method, wherein an underfill layer is formed on the circuit board under the semiconductor chip.

14. The method of claim 9, wherein the upper semiconductor package is a multi-chip package.

15. A method of manufacturing a stack type semiconductor package, comprising:
    providing a lower semiconductor package comprising a circuit board comprising an upper surface to which a semiconductor chip is adhered and on which a plurality of electrode pads are positioned;
    forming conductive adhesive layers respectively on the electrode pads of the circuit board;
    providing a jig comprising a metal plate and holes formed in the metal plate, wherein the holes are positioned to correspond to the same arrangement by which the electrode pads of the circuit board are positioned, and wherein the metal plate comprises an upper surface and a lower surface, the lower surface faces the upper surface of the lower semiconductor package;
    positioning metal pins in the holes, wherein the metal pins protrude from the upper surface of the metal plate;

stacking the jig comprising the metal pins on the conductive adhesive layers, wherein the metal pins are positioned to correspond to the same arrangement by which the electrode pads are positioned, such that the upper surface of the lower semiconductor package and the lower surface of the metal plate are adjacent to each other;

reflowing the conductive adhesive layers;

separating the metal plate of the jig from the circuit board to form the metal pins on the circuit board, wherein the metal pins are positioned to correspond to the same arrangement by which the electrode pads are positioned, and wherein the protruded metal pins pass through the upper and lower surfaces of the metal plate as the jig is separated; and vertically stacking an upper semiconductor package on the metal pins, wherein the upper semiconductor package is electrically connected to the metal pins.

16. The method of claim 15, wherein when reflowing the conductive adhesive layers, the metal pins are adhered to the conductive adhesive layers, respectively.

17. The method of claim 15, wherein the upper semiconductor package comprises external connection terminals, wherein pitches of the metal pins are equal to pitches of the external connection terminals.

18. A method of manufacturing a stack type semiconductor package, comprising:

providing a lower semiconductor package comprising a circuit board having an upper surface on which a plurality of electrode pads are positioned;

providing a jig comprising a metal plate and holes formed in the metal plate, wherein the holes are spaced apart from each other at a predetermined pitch, and wherein the metal plate comprises an upper surface and a lower surface, the lower surface faces the upper surface of the lower semiconductor package and metal pins protrude from the upper surface of the metal plate;

positioning the metal pins in the holes;

stacking the jig comprising the metal pins on the circuit board, such that the upper surface of the lower semiconductor package and the lower surface of the metal plate are adjacent to each other;

separating the metal plate of the jig from the circuit board to form the metal pins on the circuit board, wherein the protruded metal pins pass through the upper and lower surfaces of the metal plate as the jig is separated, and wherein the metal pins are spaced apart from each other at the predetermined pitch; and vertically stacking an upper semiconductor package on the metal pins, wherein the upper semiconductor package is electrically connected to the metal pins via a plurality of connection terminals spaced apart from each other at the predetermined pitch.

* * * * *